(12) United States Patent
Lee et al.

(10) Patent No.: US 8,537,095 B2
(45) Date of Patent: Sep. 17, 2013

(54) DISPLAY APPARATUS AND METHOD OF DRIVING THE SAME

(71) Applicant: Sang Cheol Shin, Yongin (KR)

(72) Inventors: Min-Cheol Lee, Seoul (KR);
Byeong-Jae Ahn, Suwon-si (KR);
Jong-Hwan Lee, Anyang-si (KR);
Yeon-Kyu Moon, Gunpo-si (KR);
Jong-Hyuk Lee, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/644,685

(22) Filed: Oct. 4, 2012

(65) Prior Publication Data
US 2013/0027287 A1 Jan. 31, 2013

Related U.S. Application Data

(62) Division of application No. 11/960,131, filed on Dec. 19, 2007, now Pat. No. 8,305,323.

(30) Foreign Application Priority Data

Mar. 8, 2007 (KR) .................. 10-2007-0023126

(51) Int. Cl.
*G09G 3/36* (2006.01)
*G09G 5/02* (2006.01)
*G11C 19/00* (2006.01)

(52) U.S. Cl.
USPC ............... 345/100; 345/691; 345/94; 345/98; 345/99; 377/64; 377/71

(58) Field of Classification Search
USPC ................ 345/691, 204, 87–104; 377/64–81
See application file for complete search history.

(56) References Cited

U.S. PATENT DOCUMENTS

| 7,023,410 | B2 * | 4/2006 | Lee et al. ................. 345/87 |
| 7,106,292 | B2 * | 9/2006 | Moon ..................... 345/100 |
| 7,446,760 | B2 | 11/2008 | Takada et al. |
| 7,825,886 | B2 | 11/2010 | Park |
| 2001/0011916 | A1 | 8/2001 | Douchi et al. |
| 2004/0041774 | A1 | 3/2004 | Moon |
| 2005/0264505 | A1 | 12/2005 | Kim |
| 2006/0238525 | A1 | 10/2006 | Hong et al. |
| 2007/0040795 | A1 | 2/2007 | Lee et al. |

FOREIGN PATENT DOCUMENTS

| CN | 1530903 A | 9/2004 |
| CN | 1809862 A | 7/2006 |
| JP | 2005-338758 A | 12/2005 |
| JP | 2006516049 A | 6/2006 |

(Continued)

*Primary Examiner* — Bipin Shalwala
*Assistant Examiner* — Ilana Spar
(74) *Attorney, Agent, or Firm* — Cantor Colburn LLP

(57) ABSTRACT

A display apparatus includes a gate driver which sequentially outputs a gate signal at a high state in response to a gate control signal and a data driver which converts image data into a data signal in response to a data control signal. The display apparatus further includes a display panel which includes a plurality of gate lines which sequentially receive the gate signal, a plurality of data lines which receive the data signal and a plurality of pixels connected to the gate and data lines and which receive the data signal in response to the gate signal to display an image. The polarity of the data signal is inverted after the gate signal transitions to a low state.

16 Claims, 10 Drawing Sheets

(56) References Cited

FOREIGN PATENT DOCUMENTS

| JP | 2007-058211 A | 3/2007 |
|---|---|---|
| KR | 1020040019708 A | 3/2004 |
| KR | 1020050066659 A | 6/2005 |
| KR | 1020050112611 A | 12/2005 |
| KR | 1020060078512 A | 7/2006 |
| KR | 1020060127644 A | 12/2006 |

* cited by examiner

DISPLAY APPARATUS AND METHOD OF DRIVING THE SAME

CROSS REFERENCE TO RELATED APPLICATIONS

This application is a divisional of U.S. patent application Ser. No. 11/960,131, filed on Dec. 19, 2007, which claims priority to Korean Patent Application No. 2007-23126, filed on Mar. 8, 2007, and all the benefits accruing therefrom under 35 U.S.C. §119, the contents of which in its entirety are herein incorporated by reference.

BACKGROUND OF THE INVENTION

1. Field of the Invention

The present invention relates to a display apparatus and a method of driving the display apparatus. More particularly, the present invention relates to a display apparatus having an improved display quality and a method of driving the display apparatus.

2. Description of the Related Art

In general, a liquid crystal display includes a liquid crystal display panel to display an image. The liquid crystal display panel includes a lower substrate, an upper substrate facing the lower substrate and a liquid crystal layer interposed between the lower substrate and the upper substrate.

The liquid crystal display further includes a plurality of gate lines, a plurality of data lines and a plurality of pixels connected to the plurality of gate and the plurality of data lines. The liquid crystal display further includes a gate driver formed directly thereon through a thin film process. The gate driver sequentially outputs a gate signal to the plurality of gate lines.

In general, the gate driver includes a shift register in which individual stages of a plurality of stages are cascaded. For example, each of the stages is turned on in response to an output signal from an adjacent previous stage and turned off in response to an output signal from an adjacent next stage.

Since a first stage does not have an associated previous stage, the first stage receives a start signal in lieu of the output signal from a previous stage. However, when the start signal has a high period longer than a horizontal scanning period and is applied to the first stage, the first stage malfunctions when the first gate signal transits to a low level. As a result, the first gate signal is distorted.

Further, when a data driver outputs a second data signal applied to a second pixel row before the first gate signal completely transits to a low level due to the distortion thereof, a pixel voltage charged to a first pixel row is reduced due to the second data signal. Thus, a malfunction occurs in which pixels of the first pixel row are brighter than other pixels in the liquid crystal display panel.

BRIEF SUMMARY OF THE INVENTION

The present invention provides a display apparatus having an improved display quality and a method of driving the display apparatus.

In one exemplary embodiment of the present invention, a display apparatus includes a gate driver, a data driver and a display panel. The gate driver sequentially outputs a gate signal at a high state in response to a gate control signal. The data driver converts image data into a data signal in response to a data control signal.

The display panel includes a plurality of gate lines which sequentially receives the gate signal, a plurality of data lines which receives the data signal and a plurality of pixels connected to the plurality of gate lines and the plurality of data lines and receives the data signal in response to the gate signal to display an image.

The polarity of the data signal is inverted at least every one line or every one dot.

The gate control signal includes a start signal, a first clock signal which determines a duration of the gate signal applied to odd-numbered gate lines of the plurality of gate lines and a second clock signal which determines a duration of the gate signal applied to even-numbered gate lines of the plurality of gate lines and has an opposite phase to a phase of the first clock signal.

The display apparatus may further include a clock generator which generates the first clock signal in response to a first output enable signal, generates the second clock signal in response to a second output enable signal, generates the second output enable signal having a phase different than a phase of the first output enable signal and generates a clock generating signal, wherein a period of the first clock signal is equal to a duration of time between a first time when the first output enable signal transitions to a first output enable signal first high state and a second time when the second output enable signal transitions to a second output enable signal first high state.

A duration of the first output enable signal first high state and a duration of the second output enable first high state may each be greater than or equal to about 5.5 microseconds.

The duration of the first output enable signal first high state and the duration of the second output enable first high state may each be greater than or equal to a duration of a first output enable signal subsequent high state and a duration of a second output enable subsequent high state, respectively.

The duration of the first output enable signal first high state and the duration of the second output enable first high state may each be about 5.5 microseconds, and the duration of the first output enable signal subsequent high state and the duration of the second output enable subsequent high state may each be about 3.7 microseconds.

A display apparatus according to an alternative exemplary embodiment of the present invention includes a gate driver which sequentially outputs gate signals in response to a gate control signal, a data driver which converts image data into a data signal in response to a data control signal and outputs the data signals and a display panel.

The display panel includes a plurality of gate lines which sequentially receives the gate signals, a plurality of data lines which receives the data signals and a plurality of pixels connected to the gate lines and the data lines and which receives the data signals in response to the gate signals to display an image.

The gate driver includes a first dummy stage which outputs a dummy carry signal in response to a start signal and a plurality of cascaded stages which operates in response to the dummy carry signal to sequentially apply the gate signal to the plurality of gate lines.

The first dummy stage is configured substantially the same as the cascaded stages.

Each of the cascaded stages of the plurality of cascaded stages turns on in response to a previous adjacent carry signal and turns off in response to a next adjacent gate signal, and the gate driver further comprises a second dummy stage which generates a dummy gate signal to turn off a last cascaded stage among the plurality of cascaded stages.

In yet another alternative exemplary embodiment of the present invention, a display apparatus includes a gate driver which sequentially outputs gate signals in response to a gate control signal, a data driver which converts image data into a data signal in response to a data control signal and outputs the data signal and a display panel.

The display panel includes a plurality of gate lines which sequentially receives the gate signals, a plurality of data lines which receives the data signals, and a plurality of pixels connected to the plurality of gate lines and the plurality of data lines and which receives the data signal in response to the gate signals to display an image.

The gate driver includes a pulse width modulator which receives a first start signal and outputs a second start signal having a pulse width smaller than that of the first start signal in response to a selection signal and a plurality of cascaded stages which operate in response to the second start signal from the pulse width modulator to sequentially apply the gate signal to the plurality of gate lines.

The second start signal has a pulse width equal to a pulse width of a horizontal scanning period of the gate signals.

The pulse width modulator includes a transistor, and the transistor includes an input electrode which receives the first start signal, a control electrode which receives the selection signal and an output electrode which outputs the second start signal.

Further, odd-numbered stages among the plurality of cascaded stages output the gate signals to odd-numbered gate lines of the plurality of gate lines in response to a first clock signal of the gate control signal. Even-numbered stages among the plurality of cascaded stages output the gate signals to even-numbered gate lines of the plurality of gate lines in response to a second clock of the gate control signal.

The second start signal is applied to a first stage, the selection signal is the second clock signal, and the first clock signal has a phase opposite to a phase of the second clock signal.

In still another alternative exemplary embodiment of the present invention, a display apparatus includes: a gate driver comprising a plurality of cascaded stages, the plurality of cascaded stages comprising a first cascaded stage and a plurality of subsequent cascaded stages to sequentially output gate signals in response to a gate control signal; a data driver which converts image data into a data signal in response to a data control signal and outputs the data signal; and a display panel.

The display panel includes: a plurality of gate lines which sequentially receives the gate signals; a plurality of data lines which receives the data signals; and a plurality of pixels connected to the plurality of gate lines and the plurality of data lines and which receives the data signals in response to the gate signals to display an image.

The first cascaded stage and each of the subsequent cascaded stages of the plurality of cascaded stages includes: a first transistor which pulls up a gate signal to a gate-on voltage; a second transistor connected to a control electrode and which receives a previous adjacent output signal to turn on the first transistor; a third transistor connected to the control electrode and which receives a next adjacent output signal to turn off the first transistor; and a fourth transistor connected to an output terminal and which receives the next adjacent output signal to pull down the gate signal to a gate-off voltage.

The fourth transistor of the first cascaded stage has a channel width greater than or equal to about two times a channel width of the fourth transistor of the subsequent cascaded stages of the plurality of cascaded stages.

The fourth transistor of the first cascaded stage may have a channel width of about 3000 micrometers, and the fourth transistor of each of the subsequent cascaded stages of the plurality of cascaded stages may have a channel width of about 1100 micrometers.

The first cascaded stage and each of the cascaded stages of the plurality of cascaded stages may further include a fifth transistor which holds an electric potential of the control electrode at the gate-off voltage.

The fifth transistor of the first cascaded stage may have a channel width less than or equal to about one-tenth of a channel width of the fifth transistor of the subsequent cascaded stages among the plurality of cascaded stages.

The fifth transistor of the first cascaded stage may have a channel width of about 25 micrometers and the fifth transistor of the subsequent cascaded stages may have a channel width of about 350 micrometers.

Further, the first cascaded stage and each of the subsequent cascaded stages of the plurality of cascaded stages further may include a sixth transistor which pulls up a carry signal to a gate-on voltage in response to an electric potential of the control electrode. The previous adjacent output signal applied to the present stage may be a previous carry signal output from the previous adjacent stage, and the next output signal applied to the present stage may be a next adjacent gate signal output from the next stage.

The first cascaded stage and each of the subsequent cascaded stages of the plurality of cascaded stages may further include a seventh transistor connected to the plurality of gate lines to discharge a gate signal to the gate-off voltage.

The seventh transistor of the first cascaded stage may have a channel width greater than or equal to about 1.5 times a channel width of the seventh transistors of the subsequent cascaded stages of the plurality of cascaded stages.

Further, the seventh transistor of the first cascaded stage may have a channel width of about 4000 micrometers and each of the seventh transistors of the subsequent cascaded stages of the plurality of cascaded stages may have a channel width of about 6000 micrometers.

In still another exemplary embodiment of the present invention, method of driving a display apparatus includes sequentially outputting gate signals at a high state in response to gate control signals, converting image data into a data signal in response to a data control signal, changing a polarity of the data signals after the gate signals transit to a low state and receiving the data signals in response to the gate signals to display an image.

The polarity of the data signals is inverted at least every one line or every one dot.

The gate control signal includes a start signal starting an output of the gate signal, a first clock signal determining a high period of odd-numbered gate signals among the gate signals and a second clock signal determining a high period of even-numbered gate signals among the gate lines and having an opposite phase to that of the first clock signal.

The method may further include generating the first clock signal in response to a first output enable signal, the second clock signal in response to a second output enable signal having a different phase with respect to the first output enable signal, and a clock generating signal, wherein a period of the first clock signal is equal to a duration of time between a first time when the first output enable signal transitions to a first output enable signal first high state and a second time when the second output enable signal transitions to a second output enable signal first high state.

Further, a duration of the first output enable signal first high state and the second output enable signal first high state may be greater than or equal to a duration of a first output enable signal subsequent high state and a duration of a second output enable subsequent high state, respectively.

According to exemplary embodiments of the present invention, a first gate signal output from a first stage of a gate driver may be lowered to a low level faster than the a timing wherein a polarity of a data signal is inverted. Thus, line defects of a first pixel row may be effectively reduced or prevented, thereby improving a display quality of a display apparatus.

BRIEF DESCRIPTION OF THE DRAWINGS

The above and other aspects, features and advantages of the present invention will become more apparent by describing in further detail exemplary embodiments thereof with reference to the accompanying drawings, in which.

DETAILED DESCRIPTION OF THE INVENTION

Figure 1:
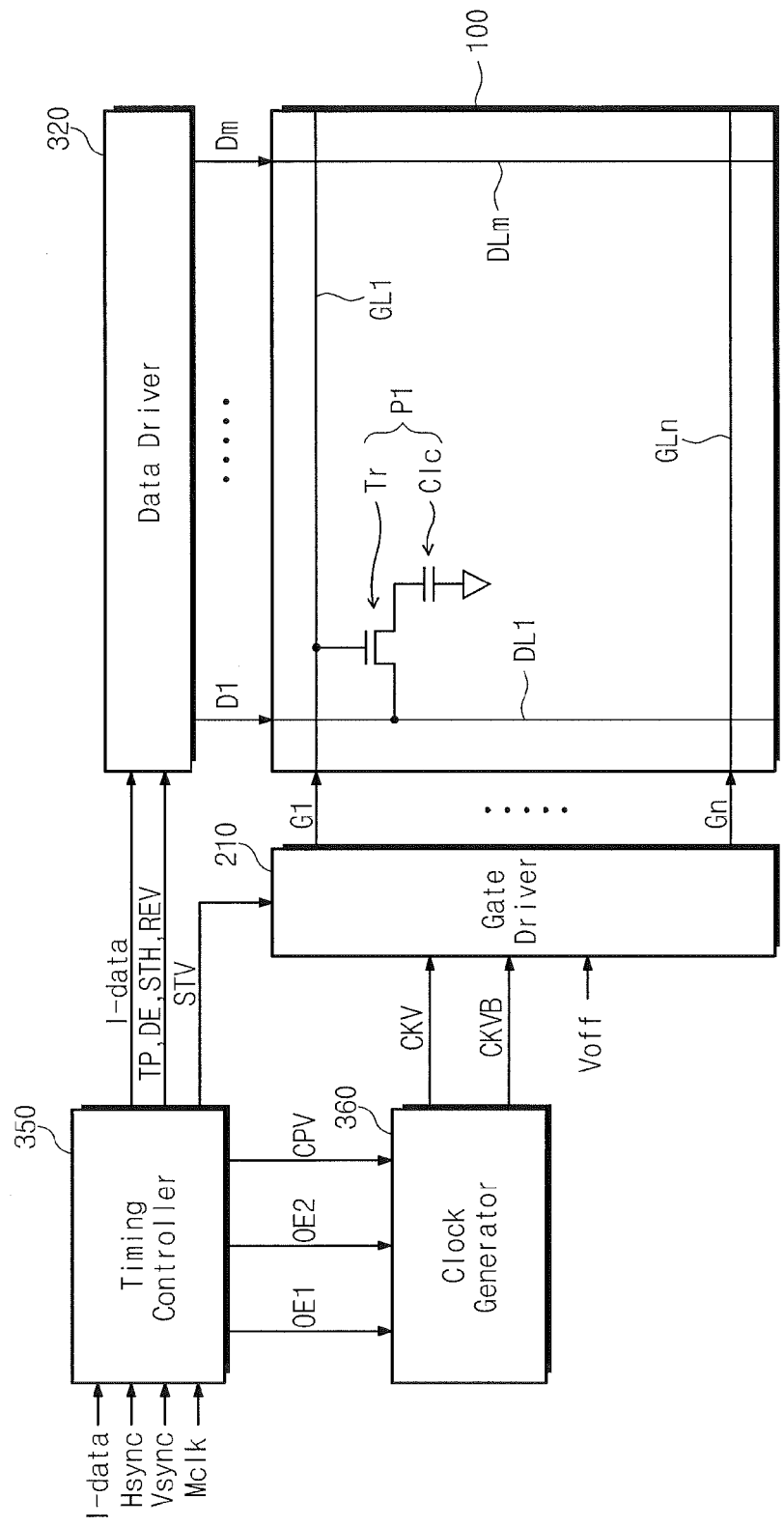
FIG. 1 is a block diagram of a liquid crystal display according to an exemplary embodiment of the present invention.

The invention will now be described more fully hereinafter with reference to the accompanying drawings, in which exemplary embodiments of the invention are shown. The present invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including," when used in this specification, specify the presence of stated features, regions, integers, steps, operations, elements and/or components, but do not preclude the presence or addition of one or more other features, regions, integers, steps, operations, elements, components and/or groups thereof.

Furthermore, relative terms, such as "lower" or "bottom" and "upper" or "top" may be used herein to describe one element's relationship to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on the "upper" side of the other elements. The exemplary term "lower" can, therefore, encompass both an orientation of "lower" and "upper," depending upon the particular orientation of the figure. Similarly, if the device in one of the figures were turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning which is consistent with their meaning in the context of the relevant art and the present disclosure, and will not be interpreted in an idealized or overly formal sense unless expressly so defined herein.

Exemplary embodiments of the present invention are described herein with reference to cross section illustrations which are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes which result, for example, from manufacturing. For example, a region illustrated or described as flat may, typically, have rough and/or nonlinear features. Moreover, sharp angles which are illustrated may be rounded. Thus, the regions illustrated in the figures are schematic in nature and their shapes are not intended to illustrate the precise shape of a region and are not intended to limit the scope of the present invention.

Hereinafter, the present invention will be described in further detail with reference to the accompanying drawings.

FIG. 1 is a block diagram of a liquid crystal display according to an exemplary embodiment of the present invention.

Referring to FIG. 1, a liquid crystal display includes a liquid crystal display panel 100 which displays an imaged thereon, a data driver 320 which outputs data signals D1-Dm to the liquid crystal display panel 100 and a gate driver 210 which outputs gate signals G1-Gn to the liquid crystal display panel 100.

The liquid crystal display panel 100 includes an array substrate (not shown), a color filter substrate (not shown) facing the array substrate and a liquid crystal layer (not shown) interposed between the array substrate and the color filter substrate.

The liquid crystal display panel 100 further includes a plurality of gate lines GL1-GLn and a plurality of data lines DL1-DLm insulated from and intersecting the gate lines GL1-GLn to define a plurality of pixel areas in a substantially matrix configuration thereon. In each of the pixel areas, a pixel P1 includes a thin film transistor Tr and a liquid crystal capacitor Clc. According to the exemplary embodiment of the present invention shown in FIG. 1, the thin film transistor Tr of a first pixel includes a gate electrode electrically connected to a first gate line GL1, a source electrode electrically connected to a first data line DL1 and a drain electrode electrically connected to a pixel electrode which serves a first electrode of the liquid crystal capacitor Clc.

The gate driver 210 may be formed directly on the liquid crystal display panel 100 and disposed adjacent to an end of the gate lines GL1-GLn. The gate driver 210 is electrically connected to an end of the gate lines GL1-GLn to sequentially apply the gate signals G1-Gn to the gate lines GL1-GLn.

The data driver 320 includes a plurality of chips (not shown), and the chips are mounted on the liquid crystal display panel 100 or on a separate film (not shown). The data driver 320 may be directly formed on the liquid crystal display panel 100 The data driver 320 is electrically connected to an end of the data lines DL1-DLm to apply the data signals D1-Dm to the data lines DL1-DLm. The data signals D1-Dm are inverted at least every one line or every one dot.

The liquid crystal display further includes a timing controller 350 and a clock generator 360 in order to control the gate driver 210 and the data driver 320.

The timing controller 350 receives an image data signal I-data and various control signals such as a vertical synchronization signal Vsync, a horizontal synchronization signal Hsync and a main clock Mclk, for example, but is not limited thereto. The timing controller 350 provides the image data signal I-data to the data driver 320 and provides data control signals such as an output start signal TP, a data enable signal DE, a horizontal start signal STH and a reverse signal REV, for example, to the data driver 320. The data driver 320 converts the image data signal I-data into the data signal D1-Dm in response to the data control signals and outputs the data signals D1-Dm to the data lines DL1-DLm.

The timing controller 350 also provides a vertical start signal STV to the gate driver 210 and provides a clock generating signal CPV, a first output enable signal OE1 and a second output enable signal OE2 to the clock generator 360. The clock generator 360 generates a first cock signal CKV and a second clock signal CKVB based on the clock generating signal CPV, and a first output enable signal OE1 and a second output enable signal OE2. The first and second clock signals CKV and CKVB, respectively, generated by the clock generator 360 are applied to the gate driver 210.

The gate driver 210 sequentially outputs the gate signals G1-Gn to the gate lines GL1-GLn in response to a gate control signal including the vertical start signal STV, and the first and second clock signals CKV and CKVB, respectively. The gate driver 210 may receive a gate-off voltage Voff.

Figure 2:
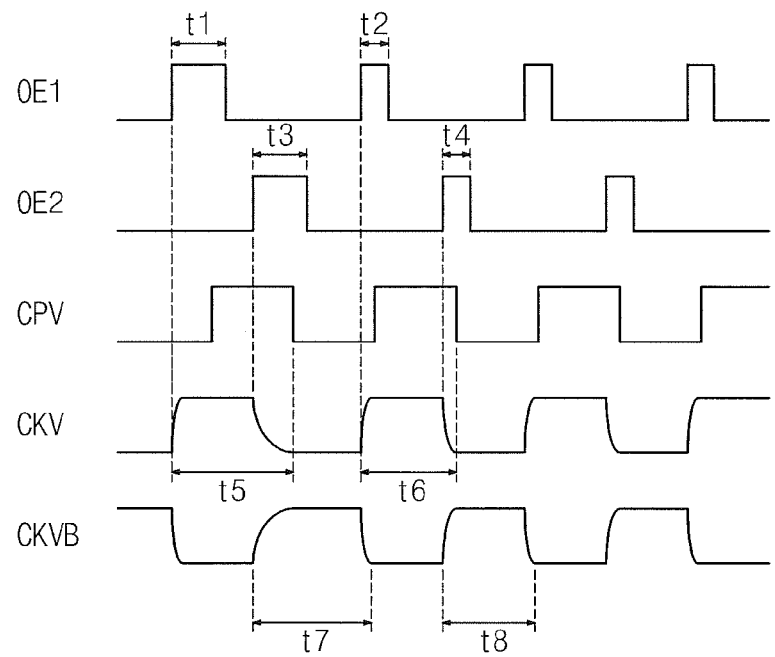
FIG. 2 is a waveform diagram showing input and output signals of a clock generator of the liquid crystal display according to the exemplary embodiment of the present invention in FIG. 1.

The clock generator 300 will now be described in further detail with reference to FIG. 2. FIG. 2 is a waveform diagram showing input and output signals of a clock generator of the liquid crystal display according to the exemplary embodiment of the present invention in FIG. 1.

Referring to FIGS. 1 and 2, the first output enable signal OE1 and the second output enable signal OE2 are periodically at a high level, and the second output enable signal OE2 is has a period equal in duration to a period of the first output enable signal OE1. The second output enable signal OE2 has a different phase than the first output enable signal OE1.

Further referring to FIG. 2, a first high period t1 of the first output enable signal OE1 is different than subsequent high periods t2 of the first output enable signal OE1. As shown in FIG. 2, the first high period t1 of the first output enable signal OE1 has a longer duration than a duration of each of the subsequent high periods t2 of the first output enable signal OE1. In an exemplary embodiment of the present invention, the first high period t1 of the first output enable signal OE1 is maintained at a high state for about 5.5 microseconds per period and each of the subsequent high periods t2 of the first output enable signal OE1 are maintained at a high state for about 3.7 microseconds per period. Put another way, the first high period t1 of the first output enable signal OE1 is maintained at a high state longer than each of the subsequent high periods t2 of the first output enable signal OE1 by about 1.8 microseconds.

Further referring to FIG. 2, a first high period t3 of the second output enable signal OE2 is different than subsequent high periods t4 of the second output enable signal OE2.

As shown in FIG. 2, the first high period t3 of the second output enable signal OE2 has a longer duration than a duration of each of the subsequent high periods t4 of the second output enable signal OE2. In an exemplary embodiment of the present invention, the first high period t3 of the second output enable signal OE2 is maintained at a high state for about 5.5 microseconds per period, and each of the subsequent high periods t4 of the second output enable signal OE2 are maintained at a high state for about 3.7 microseconds per period. Put another way, the first high period t3 of the second output enable signal OE2 is maintained at a high state longer than each of the subsequent high periods t4 of the second output enable signal OE2 by about 1.8 microseconds.

Still referring to FIG. 2, the first clock signal CKV rises to a high level corresponding to a rising edge of the first high period t1 of the first output enable signal OE1 and gradually falls to a low level corresponding to a rising edge of the first high period t3 of the second output enable signal OE2. The first clock signal CKV is at a low level corresponding to a falling edge of the clock generating signal CPV and is maintained at the low level until the second high period t2 of the first output enable signal OE1 is at a high state. Since the first high periods t1 and t3 of the first and second output enable signals OE1 and OE2, respectively, are maintained at a high state longer than each of the remaining high periods t2 and t4 of the first and second output enable signals OE1 and OE2, respectively, by about 1.8 microseconds, a first high period t5 of the first clock signal CKV has a longer duration than subsequent high periods t6 of the first clock signal CKV. Therefore, a first clock of the first clock signal CKV may be early changed in a high state by the first output enable signal OE1 and be early changed in a low state by the second output enable signal OE2. The gate driver 210 outputs the first gate signal G1 corresponding to a first high period t5 of the first clock signal CKV. Thus, the first gate signal G1 may be enough discharged before the data signal D1~Dm are applied to the data lines DL1~DLm.

Further, as shown in FIG. 2, the second clock signal CKVB has an opposite phase to a phase of the first clock signal CKV. Therefore, the first high period t7 of the second clock signal CKVB has a longer duration than subsequent high periods t8 of the second clock signal CKVB.

As described above, since the first high period t1 of the first output enable signal OE1 is maintained at a high state longer than the subsequent high periods t3 of the first output enable signal OE1 by about 1.8 microseconds, the first high period t5 of the first clock signal CKV is rapidly applied to the gate driver 210 by about 1.8 microseconds. Thus, the gate driver 210 may advance the output timing and the falling timing of the first gate signal G1 therefrom, thereby enough discharging the first gate signal G1 before the data signal are applied to the data lines. Therefore, a distortion of an image displayed on the liquid crystal display panel 100 may be prevented.

Figure 3:
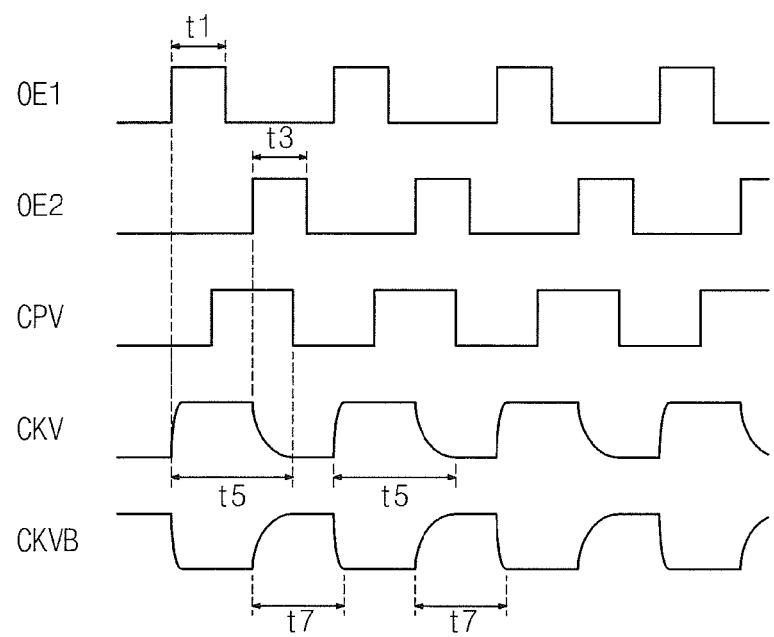
FIG. 3 is a waveform diagram showing input and output signals of a clock generator of a liquid crystal display according to an alternative exemplary embodiment of the present invention.

FIG. 3 is a waveform diagram showing input and output signals of a clock generator of a liquid crystal display according to an alternative exemplary embodiment of the present invention. Referring to FIGS. 1 and 3, a high period t1 of the first output enable signal OE1 is maintained at a high state for about 5.5 microseconds. Likewise, a high period t3 of the second output enable signal OE2 is maintained at a high state for about 5.5 microseconds. The second output enable signal OE2 has a phase different from a phase of the first output enable signal OE1.

The first clock signal CKV rises to a high level corresponding to a rising edge of the high period t1 of the first output enable signal OE1 and gradually falls to a low level corresponding to a rising edge of the high period t3 of the second output enable signal OE2. The first clock signal CKV is at a low level corresponding to a falling edge of a clock generating signal CPV and is maintained at a low level until the next subsequent high period t2 of the first output enable signal OE1. The first clock signal CKV has a plurality of high periods t5 longer than the subsequent high periods t6 of the first clock signal CKV (shown in FIG. 2). The second clock signal CKVB has a phase opposite to a phase of the first clock signal CKV. Therefore, the second clock signal CKVB has a plurality of high periods t7 longer than the subsequent high periods t8 of the second clock signal CKVB (shown in FIG. 2).

Therefore, a first clock of the first clock signal CKV may be early changed in a high state by the first output enable signal OE1 and be early changed in a low state by the second output enable signal OE2. The gate driver 210 outputs the first gate signal G1 corresponding to a first clock of the first clock signal CKV. Thus, the first gate signal G1 may be enough discharged before the data signal D1~Dm are applied to the data lines DL1~DLm.

As a result, the gate driver 210 may advance the output timing and the falling timing of the first gate signal G1 therefrom, thereby enough discharging the first gate signal G1 before the data signal D1~Dm are applied to the data lines DL1~DLm. Thus, a distortion of an image displayed on the liquid crystal display panel 100 may be prevented.

Also, since the high periods t1 and t3 of the first and second output enable signals OE1 and OE2, respectively, are maintained for 5.5 microseconds, overlap period between the clock generating signal CPV and the high periods t1 and t3 of the first and second output enable signals OE1 and OE2 is increased. Thus, a falling period of the first clock signal CKV and a rising period of the second clock signal CKVB are increased. Since the falling period of the first clock signal CKV and the rising period of the second clock signal CKVB thereby overlap each other, a predetermined time difference between the gate signals G1-Gn output from the gate driver 210 is established. Therefore, the falling period of the first clock signal CKV and the rising period of the second clock signal CKVB are increased and the time difference between adjacent gate signals among the gate signals GL1-GLn is therefore constant.

Figure 4:
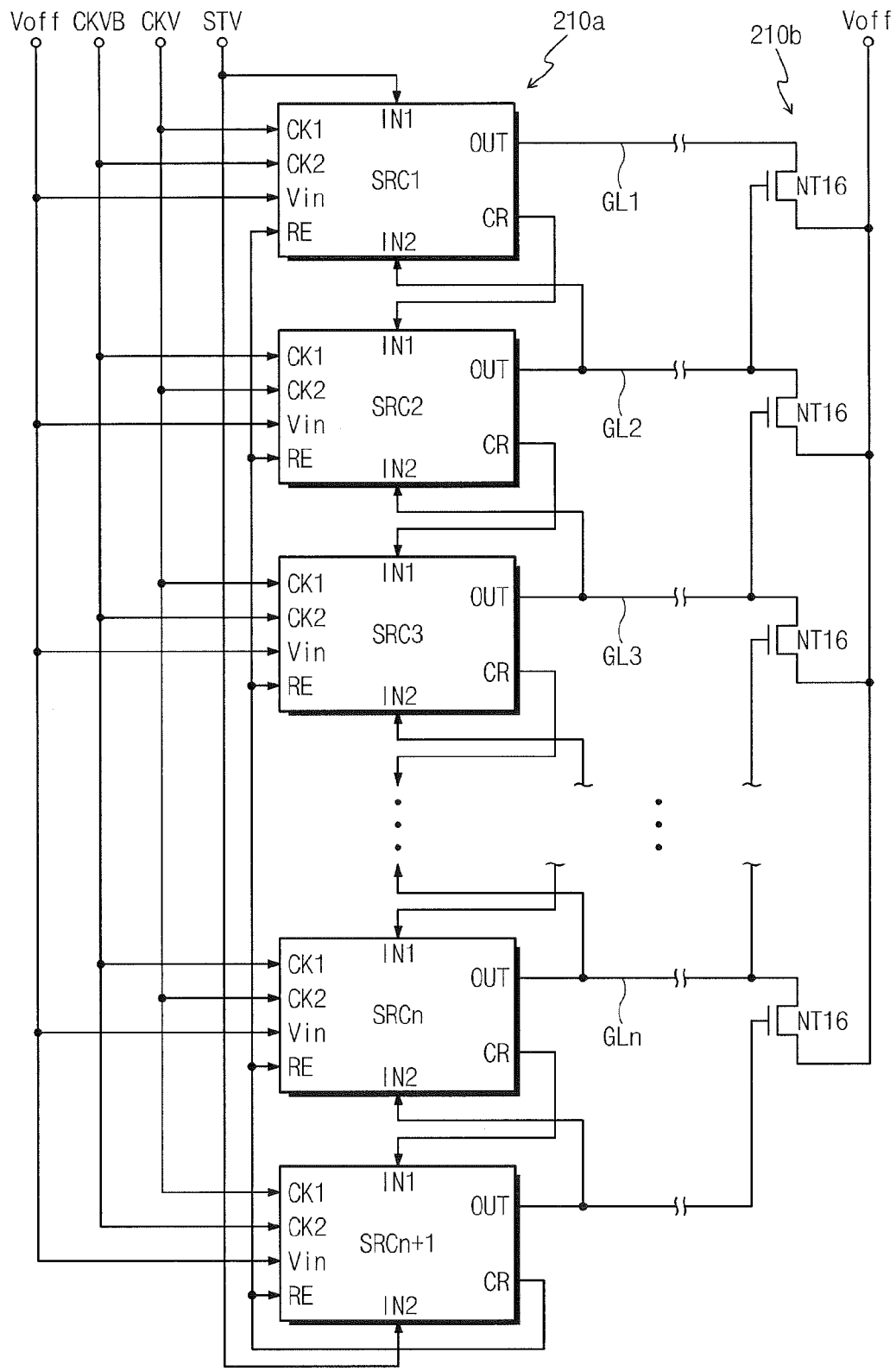
FIG. 4 is a block diagram showing a gate driver of the liquid crystal display according to the exemplary embodiment of the present invention in FIG. 1.

FIG. 4 is a block diagram showing a gate driver of the liquid crystal display according to the exemplary embodiment of the present invention in FIG. 1.

Referring to FIG. 4, the gate driver 210 includes a shift register 210a in which a plurality of stages SRC1-SRCn+1 are cascaded. Each of the stages includes a first input terminal IN1, a first clock terminal CK1, a second clock terminal CK2, a second input terminal IN2, a voltage input terminal Vin, a reset terminal RE, a carry terminal CR and an output terminal OUT.

The first input terminal IN1 of each of the stages SRC2-SRCn+1 is electrically connected to the carry terminal CR of a previous adjacent stage among the stages SRC1-SRCn to receive a previous carry signal. However, the first input terminal IN1 of a first stage SRC1 among the stages SRC1-SRCn+1 receives the vertical start signal STV which initiates an operation of the gate driver 210. The second input terminal IN2 of each of the stages SRC1-SRCn is electrically connected to the output terminal OUT of a next adjacent stage among the stages SRC2-SRCn+1 to receive a next gate signal. However, the second input terminal IN2 of a last stage SRCn+1 among the stages SRC1-SRCn+1 receives the vertical start signal STV.

The first clock signal CKV is applied to the first clock terminal CK1 of odd-numbered stages SRC1, SRC3, . . . , SRCn+1 among the stages SRC1-SRCn+1, and the second clock signal CKVB having an opposite phase to the first clock terminal CK1 is applied to the second clock terminal CK2 of the odd-numbered stages SRC1, SRC3, . . . , SRCn+1. Also, the second clock signal CKVB is applied to the first clock terminal CK1 of even-numbered stages SRC2, . . . , SRCn among the stages SRC1-SRCn+1, and the first clock signal CKV is applied to the second clock terminal CK2 of the even-numbered stages SRC2, . . . , SRCn.

The voltage input terminal Vin of each of the stages SRC1-SRCn+1 receives a ground voltage (not shown) or the gate-off voltage Voff. Further, the carry terminal CR of the last stage SRCn+1 is electrically connected to the reset terminal RE of each of the stage SRC1-SRCn+1.

The output terminals OUT of the stages SRC1-SRCn+1 are electrically connected to the gate lines GL1-GLn, respectively. Thus, the stages SRC1-SRCn+1 sequentially output the gate signals G1-Gn through the output terminals OUT to apply the gate signals G1-Gn to the gate lines GL1-GLn.

The shift register 210*a* is disposed adjacent to first ends of the gate lines GL1-GLn (FIG. 1). In one exemplary embodiment, the gate driver 210 further includes a discharge circuit 210*b* (FIG. 4) disposed adjacent to second ends of the gate lines GL1-GLn such that the discharge circuit 210*b* discharges a voltage of a respective gate line to the gate-off voltage Voff in response to the next gate signal output of the next adjacent stage. The discharge circuit 210*b* includes a plurality of discharge transistors NT16. Each discharge transistor NT16 associated with a given gate line includes a control electrode connected to a next adjacent gate line, an input electrode which receives the gate-off voltage Voff, and an output electrode connected to the associated gate line.

Figure 5A:
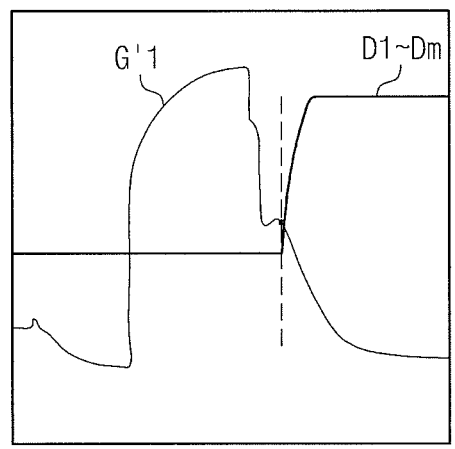
FIG. 5A is a graph of gate signals and data signals versus time illustrating a relationship between a first gate signal and data signals in a liquid crystal display of the prior art.
Figure 5B:
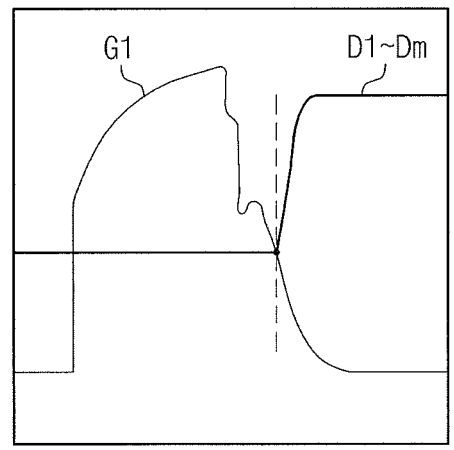
FIG. 5B is a graph of gate signals and data signals versus time illustrating a relationship between a first gate signal and data signals in a liquid crystal display according to an exemplary embodiment of the present invention.

FIG. 5A is a graph of gate signals and data signals versus time illustrating a relationship between a first gate signal and data signals in a general liquid crystal display, and FIG. 5B is a graph of gate signals and data signals versus time illustrating a relationship between a first gate signal and data signals in a liquid crystal display according to an exemplary embodiment of the present invention. Referring to FIG. 5A, the first stage receives the vertical start signal STV to initiate operation, in a manner as described above in reference to FIG. 4, since there is no adjacent prior stage to the first stage in a general gate driver.

Further, the vertical start signal STV applied to the general gate driver has a high duration longer than a duration of one horizontal scanning period. Thus, when the vertical start signal is applied to the first stage, a first gate signal G'1 output from the first stage is distorted in the falling period thereof, as shown in FIG. 5A.

When the first gate signal G'1 is distorted, the data signal is applied to a data line before the first gate signal G'1 falls to low level. More particularly, in a display device which uses a line inversion driving method, a polarity of the data signal is inverted before the first gate signal G'1 falls to a low level. As a result, when a data signal having a negative polarity is applied to a first pixel row connected to the first gate line is inverted to have a positive polarity before the first gate signal G'1 completely falls to the low level, a pixel voltage charged to the first pixel row is reduced due to the negative polarity of the data signal having the negative polarity. As a result, a line defect occurs, causing the first pixel row to become brighter than other pixel rows.

Referring to FIG. 5B, the first gate signal G1 according to an exemplary embodiment of the present invention is discharged earlier than the gate signal G'1. More specifically, as the first high period t1 of the first output enable signal OE1 (refer to FIG. 2) is early generated as about 1.8 microseconds, the first gate signal G1 is outputted from gate driver earlier than the gate signal G'1. Also, as the first high period t2 of the second output enable signal OE2 (refer to FIG. 2) is early generated as about 1.8 microseconds, the first gate signal G1 is discharged earlier than the gate signal G'1. Therefore, the first gate signal G1 may be enough discharged before the data signal D1~Dm are applied to the data lines DL1~DLm, thereby preventing a distortion of an image displayed on the liquid crystal display panel 100.

As a result, the first gate signal G1 of an exemplary embodiment of the present invention is substantially at a low level when a polarity of the data signal is inverted (FIG. 5B). Thus, the gate driver 210 according to an exemplary embodiment of the present invention prevents the first pixel row from being adversely affected by the data signal of a next pixel row, thereby effectively preventing or reducing the line defect of the first pixel row discussed above with respect to the prior art in FIG. 5A.

Figure 6A:
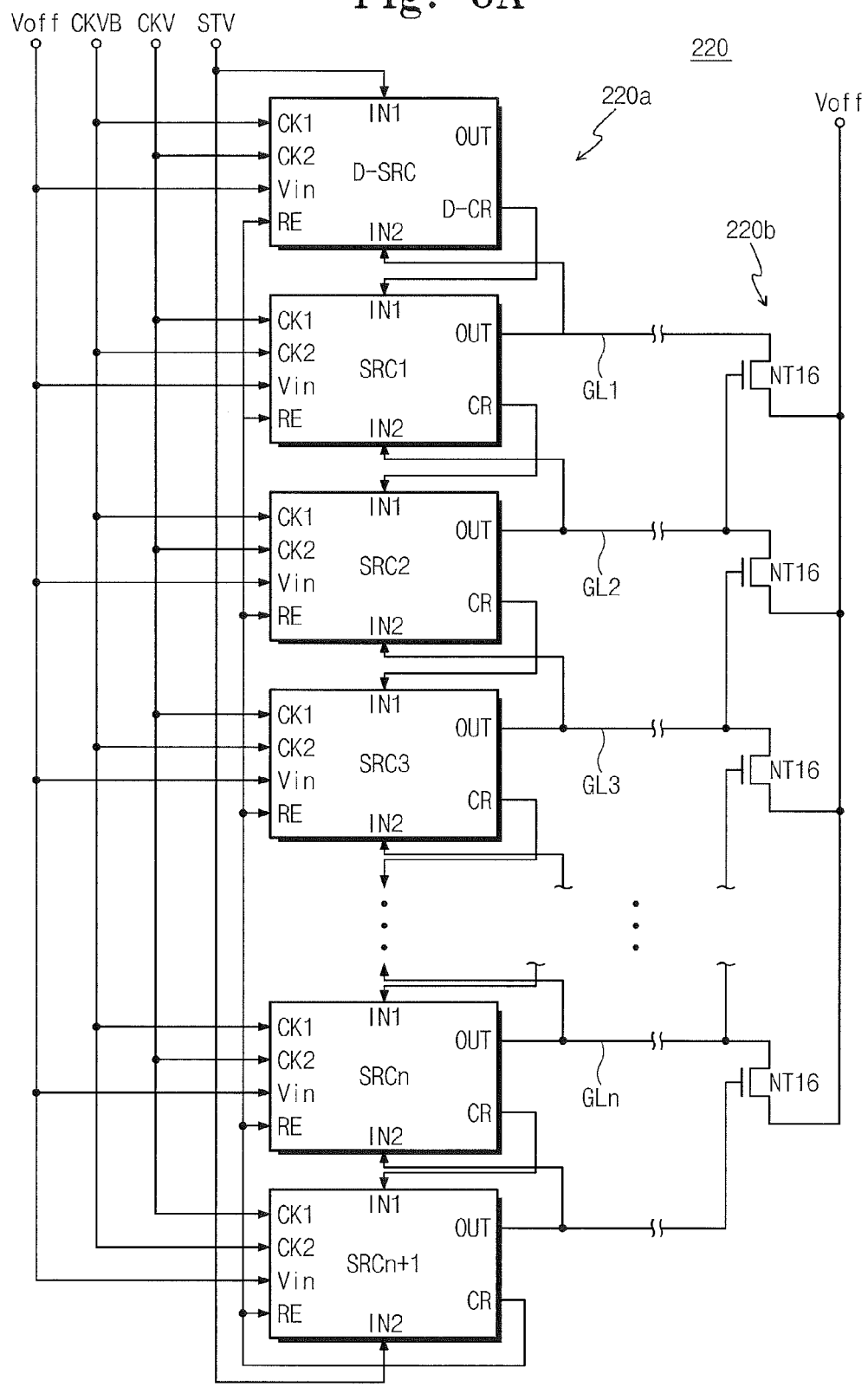
FIG. 6A is a block diagram of a gate driver of a display device according to another exemplary embodiment of the present invention.
Figure 6B:
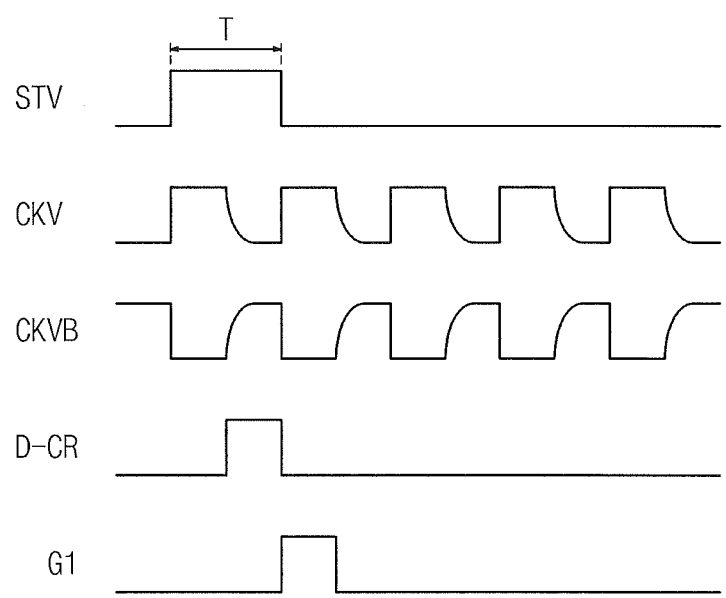
FIG. 6B is a waveform diagram illustrating input and output signals of a dummy stage D-SRC of the gate driver of the display device according to the exemplary embodiment of the present invention in FIG. 6A.

FIG. 6A is a block diagram of a gate driver of a display device according to another exemplary embodiment of the present invention, and FIG. 6B is a waveform diagram illustrating input and output signals of a dummy stage D-SRC of the gate driver of the display device according to the exemplary embodiment of the present invention in FIG. 6A. In FIG. 6A, like reference numerals denote the same or like elements in FIG. 4, and thus repetitive descriptions of the same or like elements will be omitted below.

Referring to FIG. 6A, a gate driver 220 according to another exemplary embodiment of the present invention includes a shift register 220*a* and a discharge circuit 220*b*. The shift register 220*a* includes first to (n+1)th stages SRC1-SRCn+1 and a dummy stage D-SRC.

The first to n-th stages SRC1-SRCn are connected to the first to n-th gate lines GL1-GLn of a display panel (FIG. 1) to sequentially output the gate signals G1-Gn. The (n+1)th stage SRCn+1 is provided adjacent and subsequent to the n-th stage SRCn to turn off the n-th stage SRCn. More specifically, a dummy gate signal output from output terminal OUT of the (n+1)th stage SRCn+1 is applied to the second input terminal IN2 of the n-th stage SRCn to lower the gate signal Gn output from the n-th stage SRCn to the gate-off voltage Voff.

Further, the dummy stage D-SRC is provided adjacent and prior to the first stage SRC1 and operates in response to the vertical start signal STV. The carry signal output D-CR from the dummy stage D-SRC is applied to the first input terminal IN1 of the first stage SRC1.

Referring to FIGS. 6A and 6B, the dummy stage D-SRC outputs the carry signal D-CR in response to the second clock signal CKVB during a high period of the vertical start signal STV. Also, the first stage SRC1 outputs the first gate signal G1 in response to the carry signal D-CR of the dummy stage D-SRC, so that the gate driver 220 prevents the first gate signal G1 from being distorted by the vertical start signal STV, as described in greater detail above.

Since the dummy stage D-SRC drives the first stage SRC1, the dummy stage D-SRC is not connected to the gate lines GL1-GLn. Accordingly, although the dummy gate signal output from the output terminal OUT of the dummy stage D-SRC is distorted by the vertical start signal STV, the distortion of the dummy gate signal is not displayed on the display panel.

As described above, the carry signal D-CR output from the dummy stage D-SRC is applied to the first stage SRC1 in lieu of the vertical start signal STV. Therefore, a distortion of the first gate signal output from the first stage SRC1 may be prevented, effectively preventing or reducing a line defect of the first pixel row of the display panel.

Figure 7:
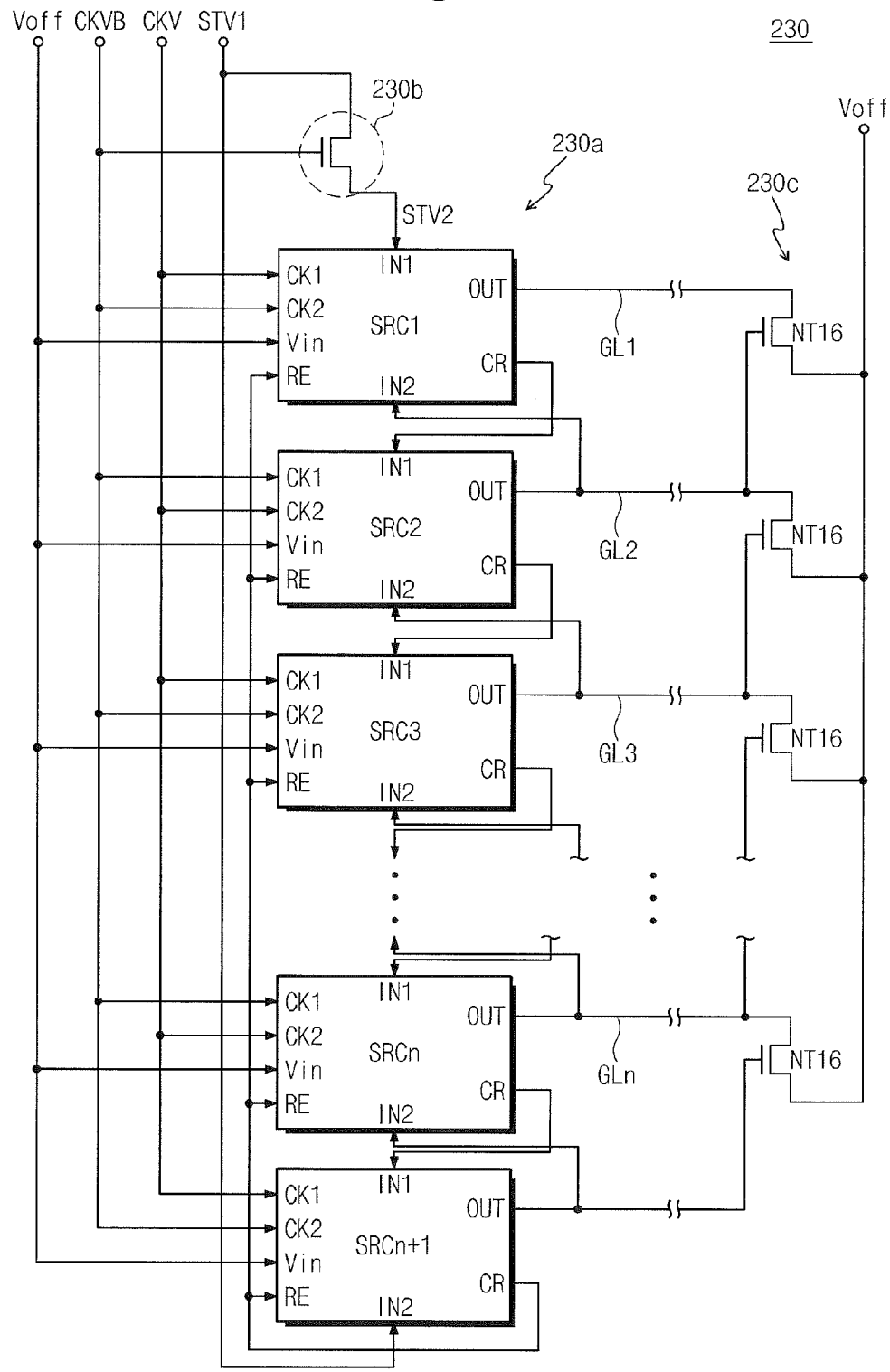
FIG. 7 is a block diagram showing a gate driver of a display device according to yet another exemplary embodiment of the present invention.
Figure 8:
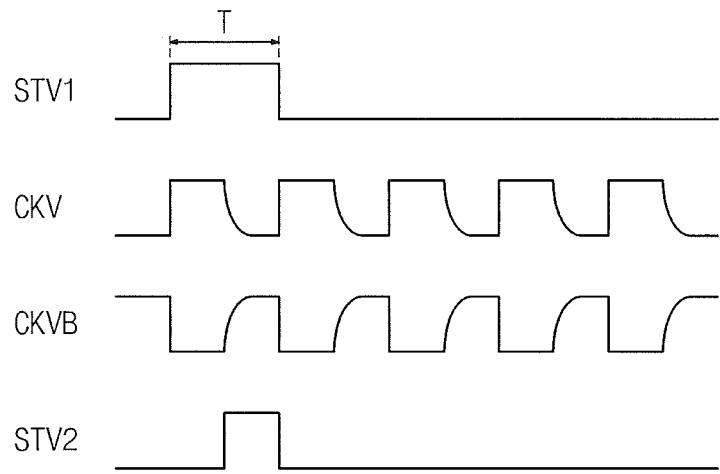
FIG. 8 is a waveform diagram illustrating input and output signals of a pulse width modulator of the gate driver of the display device according to the exemplary embodiment of the present invention in FIG. 7.
Figure 9:
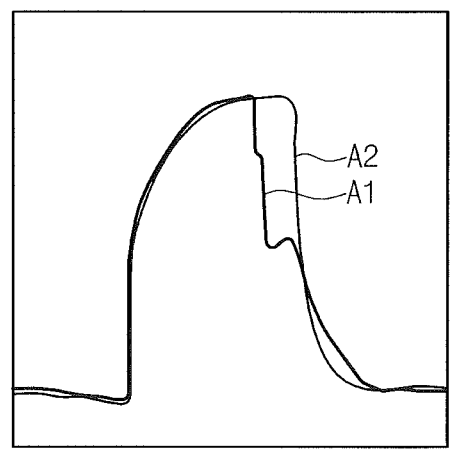
FIG. 9 is a graph illustrating a first gate signal output of the gate driver of the display device according to the exemplary embodiment of the present invention in FIG. 7.

FIG. 7 is a block diagram of a gate driver of a display device according to yet another exemplary embodiment of the present invention, FIG. 8 is a waveform diagram illustrating input and output signals of a pulse width modulator of the gate driver of the display device according to the exemplary embodiment of the present invention in FIG. 7, and FIG. 9 is a graph illustrating a first gate signal output of the gate driver of the display device according to the exemplary embodiment of the present invention in FIG. 7. In FIG. 7, like reference numerals denote the same or like elements in FIG. 4, and thus repetitive descriptions of the same or like elements will be omitted below.

Referring to FIG. 7, a gate driver 230 according to yet another exemplary embodiment of the present invention includes a shift register 230*a*, a pulse width modulator 230*b* and a discharge circuit 230*c*.

The pulse width modulator 230*b* includes a transistor. A control electrode of the transistor receives the second clock signal CKVB, an input electrode of the transistor receives a first vertical start signal STV1 and an output electrode of the transistor outputs a second vertical start signal STV2 and is connected to the first input terminal IN1 of the first stage SRC1.

Referring to FIGS. 7 and 8, the first vertical start signal STV1 is maintained at a high state for a duration which is greater than or equal to a half-period of the first clock signal CKV, and which is less than or equal to one period T of the first clock signal CKV. The second clock signal CKVB has an opposite phase to a phase the first clock signal CKV, so that the second clock signal CKVB is maintained at a low level during the high period of the first clock signal CKV. Thus, the transistor of the pulse width modulator 230b is turned on during the high period of the second clock signal CKVB, and the first vertical start signal STV1 is output through the output electrode of the transistor of the pulse width modulator 230b to the first stage SRC1.

When the second clock signal CKVB transits to a low level and the first clock signal CKV transits to a high level, the transistor of the pulse width modulator 230b is turned off and remains off during the low period of the second clock signal CKVB. Thus, the first vertical start signal STV1 applied to the transistor does not pass through the transistor of the pulse width modulator 230b to the first stage SRC1 during the low period of the second clock signal CKVB.

As a result, the second vertical start signal STV2 has a high period corresponding to half of the high period of the second clock signal CKVB and is output from the output electrode of the transistor of the pulse width modulator 230b to the first stage SRC1. The second vertical start signal STV2 output from the pulse width modulator 230b is applied to the first input terminal IN1 of the first stage SRC1 of the shift register 230a.

In FIG. 9, a first graph A1 illustrates a first gate signal G1 output from the first stage SRC1 when the first vertical start signal STV1 is applied to the first input terminal IN1 of the first stage SRC1. A second graph A2 illustrates the first gate signal G1 output from the first stage SRC1 when the second vertical start signal STV2 is applied to the first input terminal IN1 of the first stage SRC1 in accordance with an exemplary embodiment of the present invention described above.

Referring to FIG. 9, when the first vertical start signal STV1 is applied to the first stage SRC1 (A1), a falling edge of the first gate signal G1 output from the first stage SRC1 is distorted. For example, when the first vertical start signal STV1 is maintained at a high level during a low period of the first clock signal CKV, the first gate signal G1 is rapidly lowered at the falling edge of the first clock signal CKV, causing distortion.

The first gate signal G1 should be completely discharged to a low level during the high period of the second gate signal G2. However, since the first gate signal G1 is quickly lowered at the falling edge of the first clock signal CKV, as described above, an interval exists before the second gate signal G2 transits to a high level, and a period when the first gate signal G1 is maintained at an intermediate level between the low level and the high level is generated, e.g., the first gate signal G1 is distorted.

However, in the exemplary embodiment of the present invention of FIG. 7, when the second vertical start signal STV2 shown in FIG. 8 is applied to the first stage SRC1, the second vertical start signal STV2 transits to a low level when the first clock signal CKV transits to a low level, thereby preventing the first gate signal G1 from being rapidly lowered at the falling edge of the first clock signal CKV. Thus, the first gate signal G1 is maintained at a high level until the second gate signal G2 is generated and the first gate signal G1 is discharged to a low level by the second gate signal G2. Thus, the gate driver 230 according to an exemplary embodiment of the present invention prevents the distortion of the gate signal output G1 from the first stage SRC1, as shown in graph A2 of FIG. 9.

Figure 10:
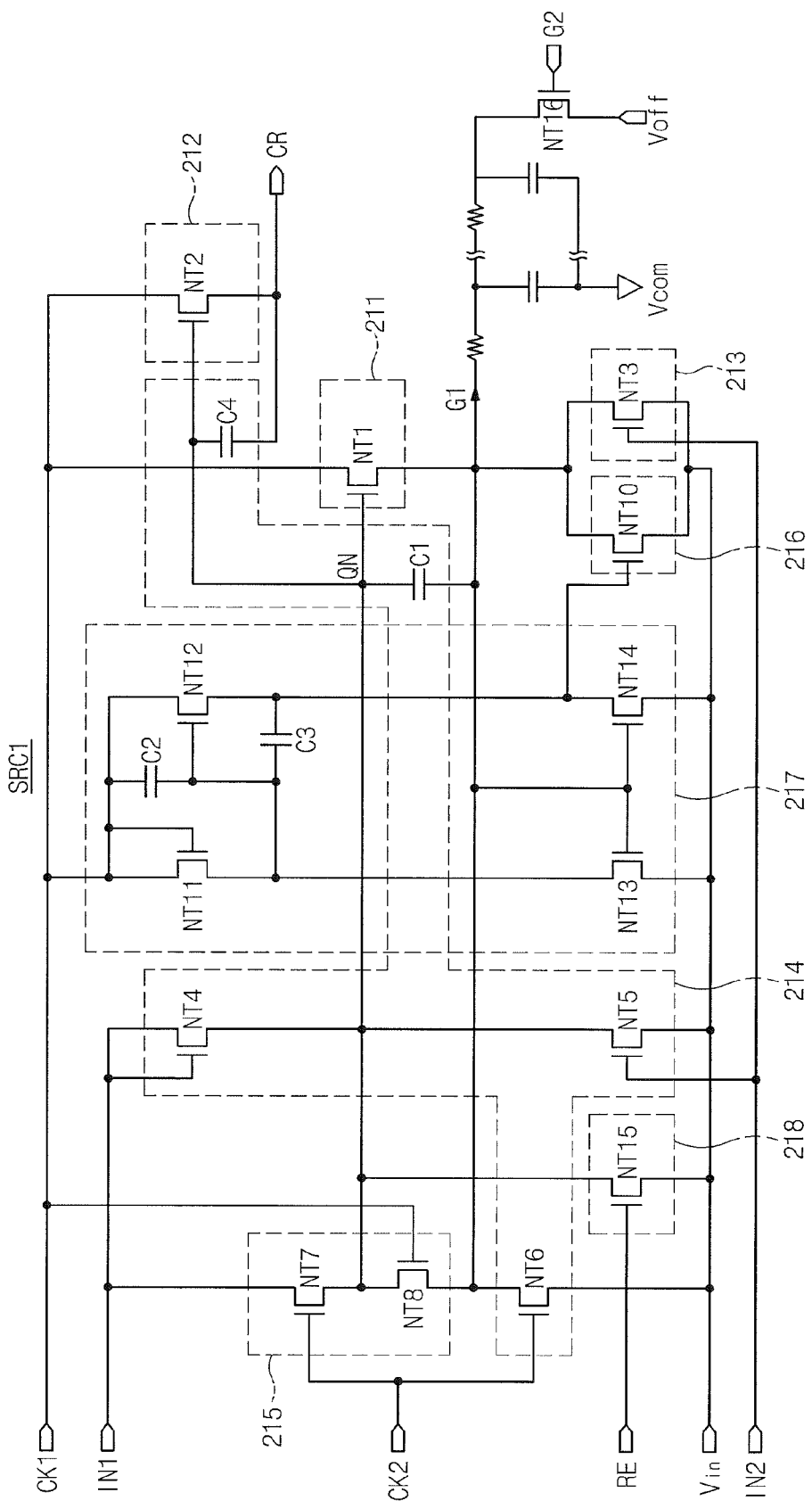
FIG. 10 is a schematic circuit diagram of a first stage of a gate driver according to another exemplary embodiment of the present invention.

FIG. 10 is a schematic circuit diagram of a first stage SRC1 of a gate driver according to another exemplary embodiment of the present invention. The first stage SRC1 described in reference to FIG. 10 has same structure and function as other stages SRC2-SRCn+1 of the gate driver, and thus repetitive descriptions of the other stages will be omitted below.

Referring to FIG. 10, the first stage SRC1 includes a pull-up part 211, a carry part 212, a pull-down part 213, a pull-up driving part 214, a ripple preventing part 215, a holding part 216, an inverter part 217 and reset part 218.

The pull-up part 211 includes a pull-up transistor NT1 of which a control electrode is connected to a node QN (hereinafter referred to as "Q-node") of the pull-up driving part 214, an input electrode is connected to a first clock terminal CK1 and an output electrode is connected to an output terminal OUT. Thus, the pull-up transistor NT1 pulls up a gate signal to the output terminal OUT to a first clock signal CKV provided through the first clock terminal CK1 in response to a control voltage output from the pull-up driving part 214, described in further detail below. The pull-up transistor NT1 is turned on during a high period of the first clock signal CKV to maintain a gate signal at a high level.

The carry part 212 includes a carry transistor NT2 of which a control electrode is connected to the Q-node QN, an input electrode is connected to the first clock terminal CK1 and an output electrode is connected to a carry terminal CR. The carry transistor NT2 pulls a carry signal applied to the output terminal OUT up to the first clock signal CKV provided through the first clock terminal CK1 in response to the control voltage output from the pull up driving part 214. The carry transistor NT2 turns on during a high period of the first clock signal CKV to maintain the carry signal at a high level.

The pull-down part 213 includes a pull-down transistor NT3 of which a control electrode is connected to a second input terminal IN2, an input electrode is connected to a voltage input terminal Vin and an output electrode is connected to an output terminal OUT. The pull-down transistor NT3 pulls down a gate signal to a gate-off voltage Voff provided through the voltage input terminal Vin (FIG. 4) in response to a next adjacent gate signal. A gate signal may be pulled down to a low level after horizontal scanning period ends, for example, but is not limited thereto in alternative exemplary embodiments of the present invention.

The pull-up driving part 214 includes a buffer transistor NT4, a first capacitor C1, a first discharge transistor NT5 and a second discharge transistor NT6, a fourth capacitor C4. The buffer transistor NT4 includes an input electrode and a control electrode commonly connected to a first input terminal IN1 and an output electrode connected to the Q-node QN. The first capacitor C1 is connected between the Q-node QN and the output terminal OUT. The first discharge transistor NT5 includes an input electrode connected to the Q-node QN, a control electrode connected to the second input terminal IN2 and an output electrode connected to the voltage input terminal Vin. The second discharge transistor NT6 includes an input electrode connected to the output terminal OUT, a control electrode connected to a second clock terminal CK2 and an output electrode connected to the voltage input terminal Vin. The fourth capacitor C4 is connected between the Q-node QN and the carry terminal CR.

When the buffer transistor NT4 turns on in response to an adjacent previous gate signal, the first and fourth capacitors C1 and C4 are charged. When a voltage above a threshold voltage of the pull-up transistor NT1 charges to the first capacitor C1, e.g., an electric potential of the Q-node QN increases above the threshold voltage and the pull-up transistor NT1 turns on. Also, when a voltage above a threshold voltage of the carry transistor NT2 charges to the fourth capacitor C2, e.g., an electric potential of the Q-node QN increases above the threshold voltage and the carry transistor NT2 turns on. Thus, the first clock signal CKV is outputted to the output terminal OUT and the carry terminal CR, so that the gate signal and the carry signal transit to a high level. The gate signal is maintained at a high level for one high period of the first clock signal CKV.

When the first discharge transistor NT5 turns on in response to a next adjacent gate signal, the voltage charged to the first capacitor C1 discharges to the gate-off voltage Voff through the first discharge transistor NT5. Thus, the electric potential of the Q-node QN is decreased to the gate-off voltage Voff by the adjacent next gate signal, thereby turning off the pull-up transistor NT1. Further, the first discharge transistor NT5 prevents the gate signal from being outputted after an associated horizontal scanning period ends.

When the second discharge transistor NT6 turns on in response to the second clock signal CKVB applied to the second clock terminal CK2, the output terminal OUT is electrically connected to the voltage input terminal Vin through the second discharge transistor NT6. Therefore, the gate signal of the output terminal OUT discharges to the gate-off voltage Voff through the second discharge transistor NT6.

The ripple preventing part 215 prevents a gate signal from rippling by the first clock signal CKV or the second clock signal CKVB during a previous horizontal scanning period (n−1)H, as described in further detail below. The ripple preventing part 215 includes a first ripple preventing transistor NT7 and a second ripple preventing transistor NT8.

The first ripple preventing transistor NT7 includes a control electrode connected to the second clock terminal CK2, an input electrode connected to the first input terminal IN1 and an output electrode connected to the Q-node QN. The second ripple preventing transistor NT8 includes a control electrode connected to the first clock terminal CK1, an input electrode connected to the Q-node QN and an output electrode connected to the output terminal OUT.

The first ripple preventing transistor NT7 turns on in response to the second clock signal CKVB provided through the second clock terminal CK2 to electrically connect the first input terminal IN1 and the Q-node QN. Accordingly, the first ripple preventing transistor NT7 holds the electric potential of the Q-node QN to the previous adjacent gate signal which is maintained at the gate-off voltage Voff. Consequently, the first ripple preventing transistor NT7 prevents the pull-up transistor NT1 from turning on during a high period of the second clock signal CKVB within the (n−1)H period, thereby preventing the gate signal from rippling.

The second ripple preventing transistor NT8 turns on in response to the first clock signal CKV to electrically connect the output terminal OUT to the Q-node QN. Thus, the electric potential of the Q-node QN is held to the gate signal which is maintained at the gate-off voltage Voff. As a result, the second ripple preventing transistor NT8 prevents the pull-up transistor NT1 from being turned on during the high period of the first clock signal CKV within the (n−1)H period, thereby preventing the present gate signal from rippling.

The holding part 216 includes a holding transistor NT10 of which a control electrode is connected to the output of the inverter part 217, an input electrode is connected to the voltage input terminal Vin and an output electrode is connected to the output terminal OUT.

The inverter part 217 includes a first inverter transistor NT11, a second inverter transistor NT12, a third inverter transistor NT13 and a fourth inverter transistor NT14, and a second capacitor C2 and a third capacitor C3 to turn the holding transistor NT10 on or off.

The first inverter transistor NT11 includes an input electrode and a control electrode commonly connected to the first clock terminal CK1 and an output electrode connected to an output electrode of the second inverter transistor NT12 through the third capacitor C3. The second inverter transistor NT12 includes an input electrode connected to the first clock terminal CK1, a control electrode connected to the input electrode thereof through the second capacitor C2 and an output electrode connected to the control electrode of the holding transistor NT10. The third inverter transistor NT13 includes an input electrode connected to the output electrode of the first inverter transistor NT11, a control electrode connected to the output terminal OUT and an output electrode connected to the voltage input terminal Vin. The fourth inverter transistor NT14 includes an input electrode connected to the control electrode of the holding transistor NT10, a control electrode connected to the output terminal OUT and an output electrode connected to the voltage input terminal Vin.

The third and fourth inverter transistors NT13 and NT14, respectively, turn on in response to a gate signal at a high level through the output terminal OUT at a high level, and the first clock signal CKV output from the first and second inverter transistors NT11 and NT12, respectively, is discharged to the gate-off voltage Voff. Thus, the holding transistor NT10 is off during a horizontal scanning period 1H when the current gate signal is maintained at a high level. When the current gate signal transits to a low level, the third and fourth inverter transistors NT13 and NT14 are turned off. Thus, the holding transistor NT10 turns on in response to the first clock input CKV output from the first and second inverter transistors NT11 and NT12, respectively. As a result, the current gate signal is held at the gate-off voltage by the holding transistor NT10 during a high period of the first clock signal CKV during the previous horizontal scanning period (n−1)H.

The reset part 218 includes a reset transistor NT15 of which a control electrode is connected to the reset terminal RE, an input electrode is connected to the Q-node QN and an output electrode is connected to the voltage input terminal Vin. The reset transistor NT15 discharges a noise input through the first input terminal IN1 to the gate-off voltage Voff which is output from the last stage SRCn+1 in response to a last gate signal Gn of the stage Gn (FIG. 4) is input through the reset terminal RE. Therefore, the pull-up transistor NT1 turns off in response to the last gate signal Gn from the stage SRCn. Consequently, the pull-up transistor NT1 turns off the pull-up transistor NT1 of each of the n stages, thereby resetting the stages SRC1-SRCn in response to the last gate signal Gn of stage SRCn.

In an exemplary embodiment of the present invention, the pull-down transistor NT3 of the first stage SRC1 has a channel width greater than or equal to about two times a channel width of the pull-down transistors NT3 of the stages SRC2-SRCn. More specifically, the pull-down transistor NT3 of the first stage SRC1 may have a channel width of about 3000 micrometers, and the pull-down transistors NT3 of each of the stages SRC2-SRCn may have a channel width of about 1100 micrometers, but is not limited thereto in alternative exemplary embodiments of the present invention.

The pull-down transistor NT3 discharges a gate signal to the gate-off voltage Voff in response to an adjacent next gate signal. When the channel width of the pull-down transistor NT3 of the first stage SRC1 is greater than a channel width of the pull-down transistors NT3 of the stages SRC2-SRCn, a discharging capability of the first stage SRC1 is enhanced. Thus, the first gate signal G1 output to the gate line GL1 from the first stage SRC1 may be discharged rapidly, even though the Q-node QN is not rapidly discharged in the first stage SRC1 due to the vertical start signal STV, and the first gate signal G1 is quickly lowered corresponding to the falling edge of the first clock signal CKV, as described in greater detail above in reference to FIG. 5B.

Therefore, since the capability of the pull-down transistor NT3 of the first stage SRC1 is improved due to the channel width of the pull-down transistor NT3 of the first stage SRC1 being greater than a channel width of the pull-down transistors NT3 of the stages SRC2-SRCn, the first gate signal G1 is rapidly discharged, thereby preventing distortion of the first gate signal G1.

The discharge transistor NT16 which is connected to the first gate line GL1 to discharge the first gate signal G1 has a channel width greater than or equal to about 1.6 times a width of a channel of the discharge transistors NT16 which are connected to the gate lines GL2-GLn to discharge the gate signals G2-Gn. More specifically, the discharge transistor NT16 connected to the first gate line GL1 may have a channel width of about 6000 micrometers, and the discharge transistors NT16 connected to the gate lines GL2-GLn may have a channel width of about 4000 micrometers.

Thus, a discharge capability of the discharge transistor NT16 which discharges the first gate signal G1 is improved in comparison to a discharge capability of the discharge transistors NT16 connected to the gate lines GL2-GLn, and the first gate signal G1 is thereby rapidly discharged, preventing distortion of the first gate signal G1.

The first ripple preventing transistor NT7 connected to the Q-node QN of the first stage SRC1 may have a channel width less than or equal to about one-tenth of a channel width of the first ripple preventing transistors NT7 of the stages SRC2-SRCn. More specifically, the first ripple preventing transistor NT7 of the first stage SRC1 may have a channel width of about 25 micrometers, and the first ripple preventing transistor NT7 of the stages SRC2-SRCn may have a channel width of about 350 micrometers.

The first ripple preventing transistor NT7 in the first stage SRC1 applies the vertical start signal STV to the Q-node QN in response to the second clock signal CKVB. However, if a capability of the first ripple preventing transistor NT7 in the first stage SRC1 is deteriorated, e.g., the channel width of the first ripple preventing transistor NT7 of the first stage SRC1 is increased, an increase of the electric potential of the Q-node QN during the high period of the second clock signal CKVB may be delayed due to the vertical start signal STV having a high level. Accordingly, as described above, the channel width of the pull-down transistor NT3 and the discharge transistor NT16 is relatively large in the first stage SRC1 and the channel width of the first ripple preventing transistor NT7 is relatively small, as compared to respective channel widths of the associated transistors in the stages SRC2-SRCn, so that distortion of the first gate signal G1 is effectively reduced or prevented.

In an exemplary embodiment of the present invention, the first stage SRC1 is disposed adjacent to a peripheral region of the display panel such that a channel width of the transistors of the first stage SRC1 may be readily enhanced as compared to in the other stages SRC2-SRCn.

Figure 11A:
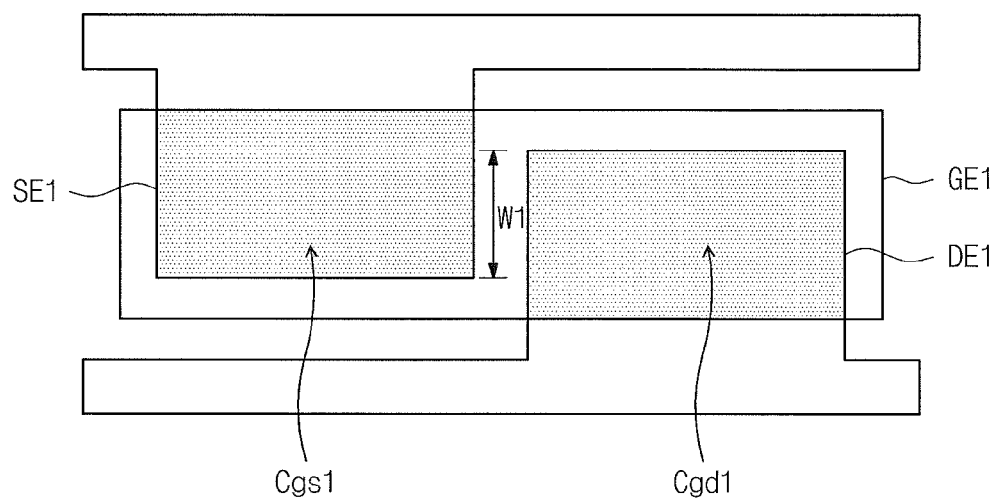
FIG. 11A is a plan view of a second ripple preventing transistor of a first stage of the gate driver according to the exemplary embodiment of the present invention in FIG. 10.
Figure 11B:
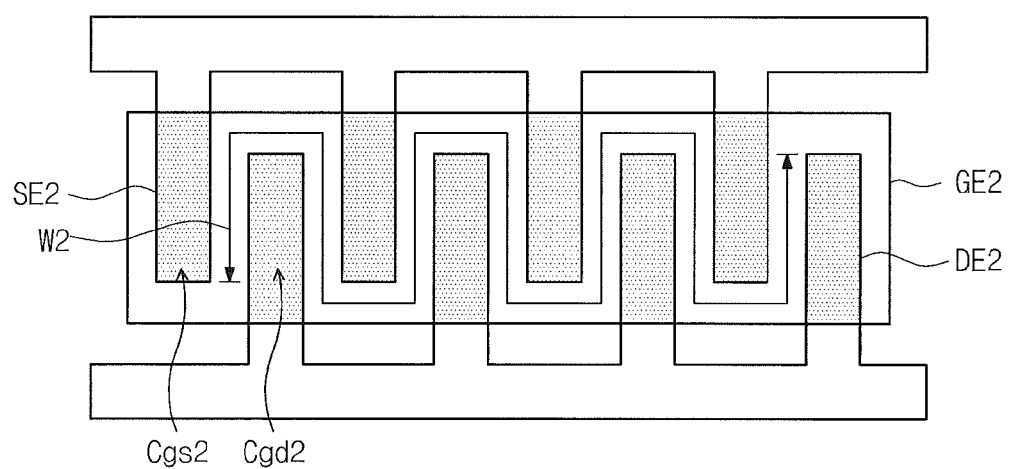
FIG. 11B is a plan view of a second ripple preventing transistor of a second stage of the gate driver according to the exemplary embodiment of the present invention in FIG. 10.

FIG. 11A is a plan view of a first ripple preventing transistor NT7 of a first stage SRC1 of the gate driver according to the exemplary embodiment of the present invention in FIG. 10, and FIG. 11B is a plan view of a first ripple preventing transistor NT7 of a second stage SRC2 of the gate driver according to the exemplary embodiment of the present invention in FIG. 10.

Referring to FIGS. 11A and 11B, the first ripple preventing transistor NT7 of the first stage SRC1 includes a first gate electrode GE1, a first source electrode SE1 and a first drain electrode DE1. The first ripple preventing transistor NT7 of the second stage SRC2 includes a second gate electrode GE2, a second source electrode SE2 and a second drain electrode DE2. The first ripple preventing transistor NT7 of the first stage SRC1 has a channel width W1 which is narrower than a channel width W2 of the second ripple preventing transistor NT8 of the second stage SRC2, as shown in FIGS. 10A and 10B.

In an exemplary embodiment of the present invention, the first ripple preventing transistor NT7 of the first stage SRC1 has a channel width of about 25 micrometers, and the first ripple preventing transistor NT7 of the second stage SRC2 has a channel width of about 350 micrometers.

As described above, when the channel width W1 of the first ripple preventing transistor NT7 of the first stage SRC1 is less than the channel width W2 of the first ripple preventing resistor NT7 of the second stage SRC2, distortion of the first gate signal G1 is effectively reduced or prevented. However, when the channel width W1 of the first ripple preventing transistor NT7 of the first stage SRC1 decreases, a ripple voltage at the Q-node QN of the first stage SRC1 may increase. More specifically, the ripple voltage at the Q-node QN of the first stage SRC1 is inversely proportional to a total capacitance of capacitors connected to the Q-node QN. For example, when a total capacitance, including parasitic capacitances, connected to the Q-node QN increases, the ripple voltage at the Q-node QN decreases.

Thus, the first ripple preventing transistor NT7 of the first stage SRC1 is designed to have a parasitic capacitance equal to a parasitic capacitance of the first ripple preventing transistor NT7 of the second stage SRC2.

More specifically, the first ripple preventing transistor NT7 of the first stage SRC1 includes a first parasitic capacitor Cgs1 formed between the first gate electrode GE1 and the first source electrode SE1 and a second parasitic capacitor Cgd1 formed between the first gate electrode GE1 and the first drain electrode DE1. The first ripple preventing transistor NT7 of the second stage SRC2 includes a third parasitic capacitor Cgs2 formed between the second gate electrode GE2 and the second source electrode SE2 and a fourth parasitic capacitor Cgd2 formed between the second gate electrode GE2 and the second drain electrode DE2 such that the parasitic capacitance of the first ripple preventing transistor NT7 of the first stage SRC1 is substantially equal to the parasitic capacitance of the first ripple preventing transistor NT7 of the second stage SRC2.

More specifically, in an exemplary embodiment of the present invention, a size of the first source electrode SE1 is such that an overlap area between the first source electrode SE1 and the first gate electrode GE1 is equal to an overlap area between the second source electrode SE2 and the second gate electrode GE2. Thus, the first parasitic capacitor Cgs1 has a capacitance equal to a capacitance of the third parasitic capacitor Cgs2.

Further, a size of the first drain electrode DE1 is such that an overlap area between the first drain electrode DE1 and the first gate electrode GE1 is equal to an overlap area between the second drain electrode DE2 and the second gate electrode GE2. Thus, the second parasitic capacitor Cgd1 has a capacitance equal to a capacitance of the fourth parasitic capacitor Cgd2.

Accordingly, the total capacitance of the capacitors connected to the Q-node QN of the first stage SRC1 is not reduced, so that the ripple voltage at the Q-node QN is effectively reduced or prevented.

According to exemplary embodiments of the present invention described herein, a first gate signal output from a first stage of a gate driver is lowered to a low level faster than a timing wherein a polarity of a data signal is inverted. Thus, line defects of a first pixel row are substantially reduced or effectively prevented.

Further, since a signal such as a carry signal from a dummy stage, for example, is used to control the first stage of the gate driver in lieu of a start signal, the first gate signal output from the first stage is not distorted in exemplary embodiments of the present invention described herein. Consequently, the line defects of the first pixel row may be further substantially reduced or effectively prevented, thereby further improving the display quality of a display apparatus.

The present invention should not be construed as being limited to the exemplary embodiments thereof which have been described herein. Rather, these exemplary embodiments are provided so that this disclosure will be thorough and complete and will fully convey the concept of the present invention to those skilled in the art.

While the present invention has been particularly shown and described with reference to exemplary embodiments thereof, it will be understood by those having ordinary skill in the art that various changes and modifications may be made therein by one of ordinary skill in the art without departing from the spirit and scope of the present invention as defined by the following claims.

What is claimed is:

1. A display apparatus comprising:
   a gate driver which sequentially outputs gate signals in response to a gate control signal;
   a data driver which converts image data into a data signal in response to a data control signal and outputs the data signal; and
   a display panel comprising:
      a plurality of gate lines which sequentially receives the gate signals;
      a plurality of data lines which receives the data signals; and
      a plurality of pixels connected to the plurality of gate lines and the plurality of data lines and which receives the data signal in response to the gate signals to display an image,
   wherein the gate driver comprises:
      a pulse width modulator which receives a first start signal and outputs a second start signal having a pulse width smaller than that of the first start signal in response to a selection signal; and
      a plurality of cascaded stages which operate in response to the second start signal from the pulse width modulator to sequentially apply the gate signal to the plurality of gate lines.

2. The display apparatus of claim 1, wherein the second start signal has a pulse width equal to a pulse width of a horizontal scanning period of the gate signals.

3. The display apparatus of claim 1, wherein the pulse width modulator comprises a transistor, the transistor comprising:
   an input electrode which receives the first start signal;
   a control electrode which receives the selection signal; and
   an output electrode which outputs the second start signal.

4. The display apparatus of claim 1, wherein odd-numbered stages among the plurality of cascaded stages output the gate signals to odd-numbered gate lines of the plurality of gate lines in response to a first clock signal of the gate control signal, and even-numbered stages among the plurality of cascaded stages output the gate signals to even-numbered gate lines of the plurality of gate lines in response to a second clock of the gate control signal.

5. The display apparatus of claim 3, wherein the second start signal is applied to a first stage, and the selection signal is the second clock signal.

6. The display apparatus of claim 3, wherein the first clock signal has a phase opposite to a phase of the second clock signal.

7. The display apparatus of claim 1, wherein the pulse width modulator comprises a first dummy stage which outputs the second star signal in response to the first start signal.

8. The display apparatus of claim 7, wherein the first dummy stage is configured substantially the same as the cascaded stages.

9. The display apparatus of claim 1, wherein each of the cascaded stages of the plurality of cascaded stages turns on in response to a previous adjacent carry signal and turns off in response to a next adjacent gate signal, and the gate driver further comprises a second dummy stage which generates a dummy gate signal to turn off a last cascaded stage among the plurality of cascaded stages.

10. A display apparatus comprising:
   a gate driver comprising a plurality of cascaded stages, the plurality of cascaded stages comprising a first cascaded stage and a plurality of subsequent cascaded stages to sequentially output gate signals in response to a gate control signal;
   a data driver which converts image data into a data signal in response to a data control signal and outputs the data signal; and
   a display panel comprising:
      a plurality of gate lines which sequentially receives the gate signals;
      a plurality of data lines which receives the data signals; and
      a plurality of pixels connected to the plurality of gate lines and the plurality of data lines and which receives the data signals in response to the gate signals to display an image,
   wherein the first cascaded stage and each of the subsequent cascaded stages of the plurality of cascaded stages comprises:
      a first transistor which pulls up a gate signal to a gate-on voltage;
      a second transistor connected to a control electrode and which receives a previous adjacent output signal to turn on the first transistor;
      a third transistor connected to the control electrode and which receives a next adjacent output signal to turn off the first transistor; and
      a fourth transistor connected to an output terminal and which receives the next adjacent output signal to pull down the gate signal to a gate-off voltage,
   wherein the fourth transistor of the first cascaded stage has a channel width greater than or equal to about two times a channel width of the fourth transistor of the subsequent cascaded stages of the plurality of cascaded stages.

11. The display apparatus of claim 10, wherein the first cascaded stage and each of the cascaded stages of the plurality of cascaded stages further comprises a fifth transistor which holds an electric potential of the control electrode at the gate-off voltage.

12. The display apparatus of claim 11, wherein the fifth transistor of the first cascaded stage has a channel width less than or equal to about one-tenth of a channel width of the fifth transistor of the subsequent cascaded stages among the plurality of cascaded stages.

13. The display apparatus of claim 10, wherein:
the first cascaded stage and each of the subsequent cascaded stages of the plurality of cascaded stages further comprises a sixth transistor which pulls up a carry signal to a gate-on voltage in response to an electric potential of the control electrode,
the previous adjacent output signal applied to the present stage is a previous carry signal output from the previous adjacent stage, and
the next output signal applied to the present stage is a next adjacent gate signal output from the next stage.

14. The display apparatus of claim 10, wherein the first cascaded stage and each of the subsequent cascaded stages of the plurality of cascaded stages further comprises a seventh transistor connected to the plurality of gate lines to discharge a gate signal to the gate-off voltage.

15. The display apparatus of claim 14, wherein the seventh transistor of the first cascaded stage has a channel width greater than or equal to about 1.5 times a channel width of the seventh transistors of the subsequent cascaded stages of the plurality of cascaded stages.

16. The display apparatus of claim 14, wherein the seventh transistor of the first cascaded stage has a channel width of about 4000 micrometers and each of the seventh transistors of the subsequent cascaded stages of the plurality of cascaded stages has a channel width of about 6000 micrometers.

* * * * *